US011251155B2

(12) United States Patent
Lee et al.

(10) Patent No.: US 11,251,155 B2
(45) Date of Patent: Feb. 15, 2022

(54) SEMICONDUCTOR PACKAGE

(71) Applicant: SAMSUNG ELECTRONICS CO., LTD., Suwon-si (KR)

(72) Inventors: Sangkil Lee, Suwon-si (KR); So-young Kim, Suwon-si (KR); Soo-woong Ahn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 5 days.

(21) Appl. No.: 16/689,769

(22) Filed: Nov. 20, 2019

(65) Prior Publication Data

US 2020/0381393 A1    Dec. 3, 2020

(30) Foreign Application Priority Data

May 30, 2019  (KR) .......................... 10-2019-0063579

(51) Int. Cl.
| | |
|---|---|
| *H01L 25/065* | (2006.01) |
| *H01L 25/18* | (2006.01) |
| *H01L 23/538* | (2006.01) |
| *H01L 23/522* | (2006.01) |
| *H01L 23/498* | (2006.01) |
| *H01L 29/786* | (2006.01) |
| *H01L 29/78* | (2006.01) |
| *H01L 29/423* | (2006.01) |

(52) U.S. Cl.
CPC ...... *H01L 25/0652* (2013.01); *H01L 23/5383* (2013.01); *H01L 23/5385* (2013.01); *H01L 23/5386* (2013.01); *H01L 29/42392* (2013.01); *H01L 29/785* (2013.01)

(58) Field of Classification Search
CPC ...... H01L 25/0652; H01L 24/32; H01L 24/46
See application file for complete search history.

(56) References Cited

U.S. PATENT DOCUMENTS

| | | | |
|---|---|---|---|
| 9,218,854 | B2 | 12/2015 | Stephens, Jr. |
| 9,432,298 | B1 | 8/2016 | Smith |
| 9,508,688 | B2 | 11/2016 | Kim |
| 9,679,615 | B2 | 6/2017 | Jeddeloh et al. |
| 10,163,791 | B2 | 12/2018 | Akiba et al. |
| 2016/0111406 | A1* | 4/2016 | Mak ................. H01L 25/0652 257/773 |
| 2017/0256291 | A1 | 9/2017 | Lee |
| 2018/0232275 | A1 | 8/2018 | Casper et al. |
| 2019/0198083 | A1* | 6/2019 | Biswas ................ H01L 24/00 |
| 2019/0221556 | A1* | 7/2019 | Gomes ............. H01L 23/522 |
| 2019/0259695 | A1* | 8/2019 | Gandhi ............. H01L 23/642 |

FOREIGN PATENT DOCUMENTS

| | | |
|---|---|---|
| JP | 2018-93107 A | 6/2018 |
| KR | 10-2018-0133524 A | 12/2018 |

* cited by examiner

*Primary Examiner* — Omar F Mojaddedi
(74) *Attorney, Agent, or Firm* — Sughrue Mion, PLLC

(57) ABSTRACT

Disclosed is a semiconductor package comprising a logic die mounted on an interposer substrate, and a memory stack structure disposed side-by-side with the logic die. The memory stack structure includes a buffer die mounted on the interposer substrate, and a plurality of memory dies stacked on the buffer die. The buffer die has a first surface that faces the interposer substrate and a second surface that faces the plurality of memory dies. The number of data terminals on the second surface is greater the number of connection terminals on the first surface.

16 Claims, 5 Drawing Sheets

SEMICONDUCTOR PACKAGE

CROSS-REFERENCE TO RELATED APPLICATION

This application is based on and claims priority under 35 U.S.C. § 119 from Korean Patent Application No. 10-2019-0063579 filed on May 30, 2019 in the Korean Intellectual Property Office, the entire contents of which are hereby incorporated by reference.

BACKGROUND

The disclosure relates to a semiconductor package, and more particularly, to a semiconductor package in which a logic die and a memory stack structure are disposed side by side.

In the semiconductor industry, high capacity, thinness, and small size of semiconductor devices and electronic products using the same have been demanded and thus various package techniques have been suggested. A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, electronic products have increasingly demands for high performance, high speed, and compact size.

SUMMARY

Certain example embodiments of the disclosure provide a semiconductor package with improved electrical characteristics and increased operating speed.

According to an aspect of the disclosure, there is provided a semiconductor package, comprising: a logic die provided on an interposer substrate; and a memory stack structure provided adjacent to the logic die, wherein the memory stack structure comprises: a buffer die provided on the interposer substrate; and a plurality of memory dies stacked on the buffer die, wherein the buffer die has a first surface that faces the interposer substrate and a second surface that faces the plurality of memory dies, and wherein a number of data terminals on the second surface is greater than a number of connection terminals on the first surface.

According to another aspect of the disclosure, there is provided a semiconductor package, comprising: a logic die provided on an interposer substrate; and a memory stack structure provided adjacent to the logic die, wherein the memory stack structure comprises: a buffer die provided on the interposer substrate; and a plurality of memory dies stacked on the buffer die, wherein the buffer die comprises an active layer, the active layer comprising: a first active pattern provided on a first substrate; a first device isolation layer provided on the first substrate and configured to define the first active pattern; and a first gate electrode provided on a channel of the first active pattern, wherein the channel of the first active pattern is positioned higher than an upper surface of the first device isolation layer.

According to another aspect of the disclosure, there is provided a semiconductor package, comprising: a logic die provided on an interposer substrate; and a memory stack structure provided adjacent to the logic die, wherein the memory stack structure comprises: a buffer die provided on the interposer substrate; and a memory die provided on the buffer die, wherein a number of bumps between the buffer die and the memory die is greater than a number of bumps between the buffer die and the interposer substrate.

BRIEF DESCRIPTION OF THE DRAWINGS

The above and/or other aspects of the disclosure will be more apparent by describing certain embodiments of the present disclosure with reference to the accompanying drawings, in which.

DETAILED DESCRIPTION OF EMBODIMENTS

Figure 1:
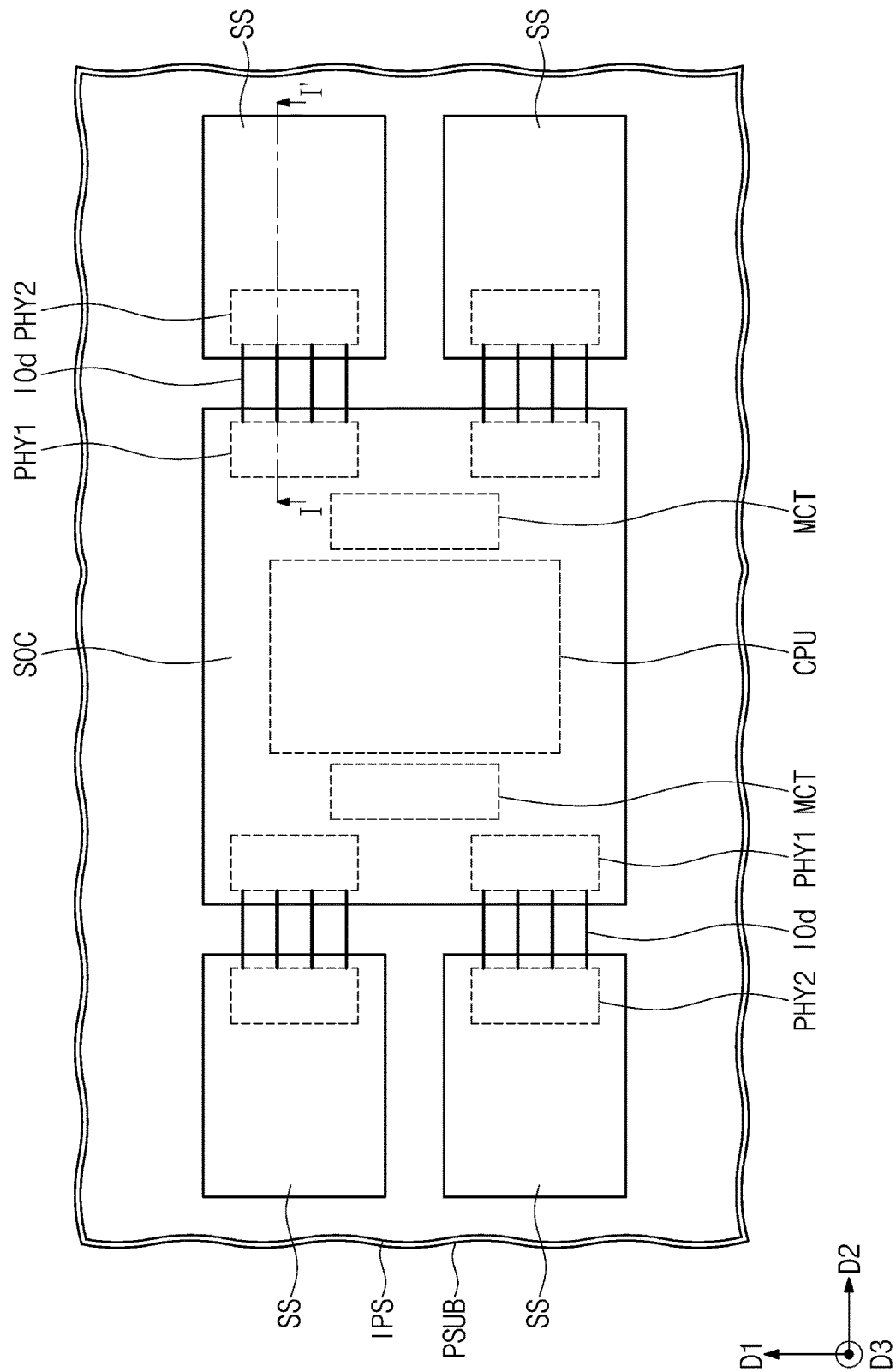
FIG. 1 illustrates a plan view showing a semiconductor package according to an embodiment of the disclosure.
Figure 2:
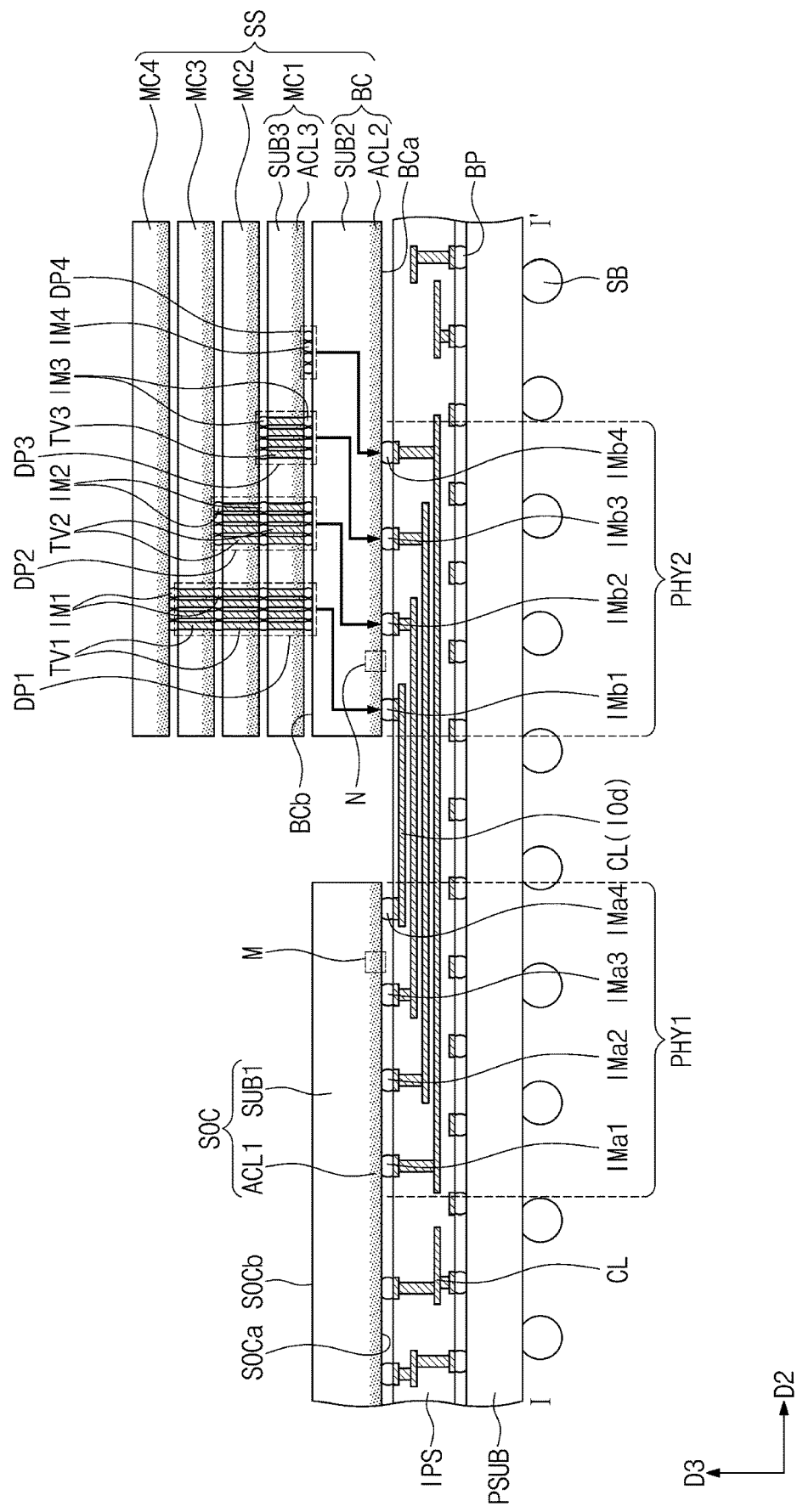
FIG. 2 illustrates a cross-sectional view taken along line I-I' of FIG. 1.
Figure 3:
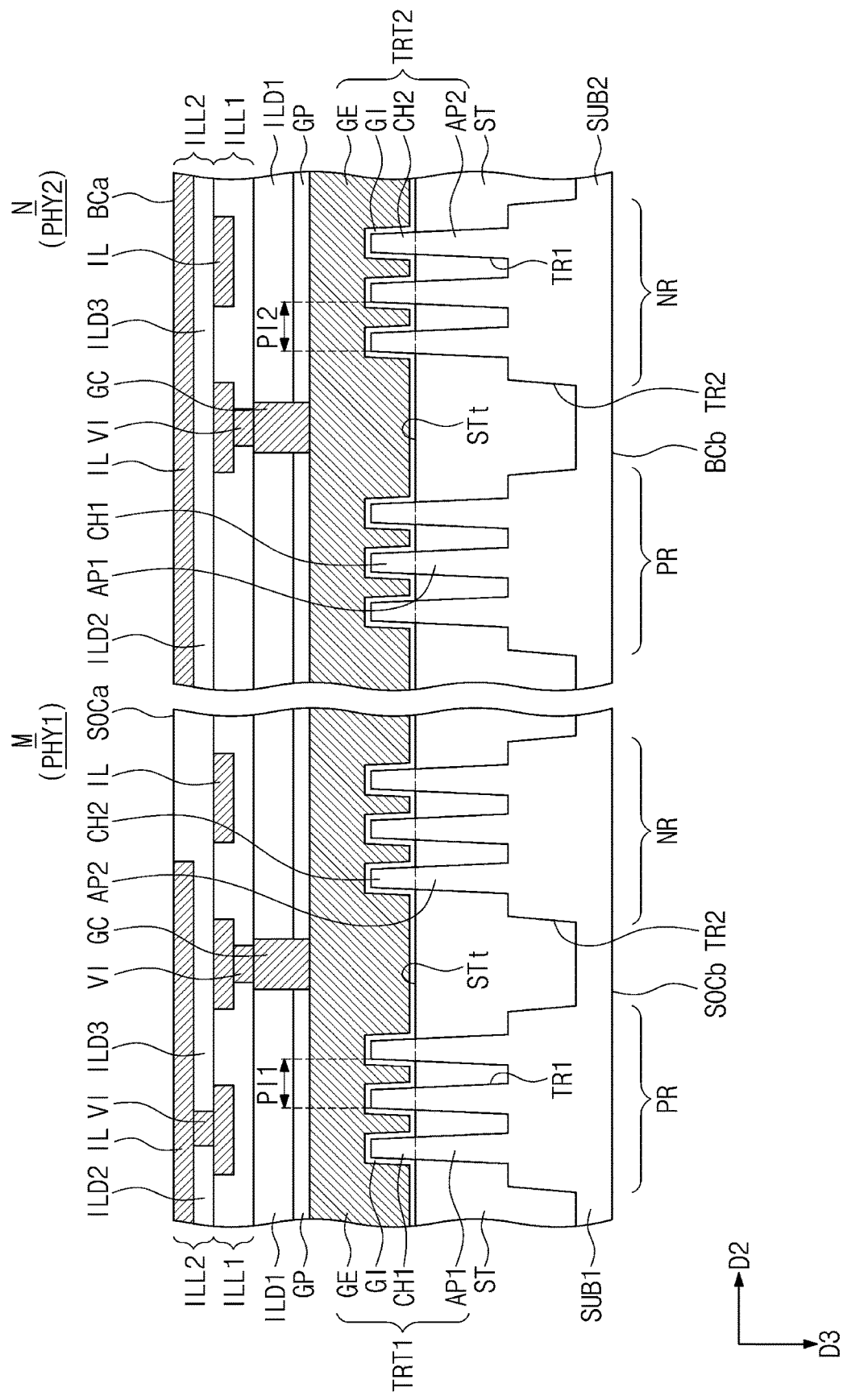
FIG. 3 illustrates an enlarged cross-sectional view showing sections M and N of FIG. 2.

FIG. 1 illustrates a plan view showing a semiconductor package according to an embodiment of the disclosure. FIG. 2 illustrates a cross-sectional view taken along line I-I' of FIG. 1. FIG. 3 illustrates an enlarged cross-sectional view showing sections M and N of FIG. 2.

Referring to FIGS. 1 to 3, a package substrate PSUB may be provided. An interposer substrate IPS may be provided on the package substrate PSUB. For example, the package substrate PSUB may be a printed circuit board (PCB). The interposer substrate IPS may be a redistribution substrate. Bumps BP may be provided on a bottom surface of the interposer substrate ISP. The bumps BP may be interposed between the interposer substrate IPS and the package substrate PSUB. Solder balls SB may be provided on a bottom surface of the package substrate PSUB. According to an embodiment, routing lines and at least one via may be provided on the package substrate PSUB.

A logic die SOC and a plurality of memory stack structures SS may be disposed on the interposer substrate ISP. For example, four memory stack structures SS may be disposed around the logic die SOC. However, the disclosure is not limited thereto, and the number of the memory stack structures SS may vary. The logic die SOC and each of the memory stack structures SS may be mounted side-by-side on the interposer substrate ISP.

The logic die SOC may include a central processing unit CPU, a physical-layer interface PHY, and a memory controller MCT. For example, the logic die SOC may be a system-on-chip. The logic die SOC may have a first surface SOCa that faces the interposer substrate IPS and a second surface SOCb opposite to the first surface SOCa. The logic die SOC may include a first substrate SUB1 and a first active layer ACL1 on the first substrate SUB1. The first active layer ACL1 may be adjacent to the first surface SOCa. The first substrate SUB1 may be adjacent to the second surface SOCb.

The first active layer ACL1 may include first transistors TRT1 formed on the first substrate SUB1. Also, the first active layer ACL1 may include connection line layers ILL1 and ILL2 on the first transistors TRT1. The first active layer ACL1 will be further discussed in detail below with reference to FIG. 3. The interposer substrate IPS may be mounted thereon with the logic die SOC in a face-down state in which the first active layer ACL1 faces the interposer substrate ISP.

First connection terminals IMa1 to IMa4 may be interposed between the logic die SOC and the interposer substrate ISP. For example, the first connection terminals IMa1 to IMa4 may include a first terminal IMa1, a second terminal IMa2, a third terminal IMa3, and a fourth terminal IMa4. Each of the first connection terminals IMa1 to IMa4 may be a micro-bump.

The logic die SOC may be flip-chip bonded through the first connection terminals IMa1 to IMa4 onto the interposer substrate ISP. According to an embodiment, an under-fill resin layer may fill between the logic die SOC and the interposer substrate ISP.

The plurality of memory stack structures SS may have substantially the same structure. The following description will exemplarily describe in detail one of the plurality of memory stack structures SS. The memory stack structure SS may include a buffer die BC and first to fourth memory dies MC1 to MC4 that are sequentially stacked on the buffer die BC.

The buffer die BC may have a first surface BCa that faces the interposer substrate IPS and a second surface BCb opposite to the first surface BCa. For instance, the second surface BCb faces a direction opposite to the direction the first surface BCa faces. The buffer die BC may include a second substrate SUB2 and a second active layer ACL2 on the second substrate SUB2. The second active layer ACL2 may be adjacent to the first surface BCa. The second substrate SUB2 may be adjacent to the second surface BCb.

The second active layer ACL2 may include an integrated circuit. For example, the second active layer ACL2 may include a memory circuit, a logic circuit, or a combination thereof. The logic circuit of the second active layer ACL2 may include a latch circuit that processes data signals input to and output from the first to fourth memory dies MC1 to MC4.

The second active layer ACL2 may include second transistors TRT2 formed on the second substrate SUB2 and also include connection line layers ILL1 and ILL2 on the second transistors TRT2. The second active layer ACL2 will be further discussed in detail below with reference to FIG. 3. The interposer substrate IPS may be mounted thereon with the buffer die BC in a face-down state in which the second active layer ACL2 faces the interposer substrate ISP.

According to an embodiment, Second connection terminals IMb1 to IMb4 may be interposed between the buffer die BC and the interposer substrate ISP. For example, the second connection terminals IMb1 to IMb4 may include a first terminal IMb1, a second terminal IMb2, a third terminal IMb3, and a fourth terminal IMb4. For example, each of the second connection terminals IMb1 to IMb4 may be a micro-bump.

The buffer die BC may be flip-chip bonded through the second connection terminals IMb1 to IMb4 onto the interposer substrate ISP. According to an embodiment, an underfill resin layer may fill between the buffer die BC and the interposer substrate ISP.

The first to fourth memory dies MC1 to MC4 may be dynamic random access memory (DRAM) chips. In certain embodiments, the first to fourth memory dies MC1 to MC4 may have substantially the same chip size. For example, the first to fourth memory dies MC1 to MC4 may have substantially the same planar shape and size.

Each of the first to fourth memory dies MC1 to MC4 may include a third substrate SUB3 and a third active layer ACL3 on the third substrate SUB3. The third active layer ACL3 may include memory transistors and connection line layers on the memory transistors. A memory circuit may be constituted by the memory transistors and the connection line layers in the third active layer ACL3. The interposer substrate IPS may be mounted thereon with each of the first to fourth memory dies MC1 to MC4 in a face-down state in which the third active layer ACL3 faces the interposer substrate ISP.

The third memory die MC3 may include first through vias TV1 that penetrate through the third memory die MC3. The second memory die MC2 may include first through vias TV1 and second through vias TV2 that penetrate through the second memory die MC2. The first memory die MC1 may include first through vias TV1, second through vias TV2, and third through vias TV3 that penetrate through the first memory die MC1. The fourth memory die MC4 may include no through vias, but the disclosure is not specifically limited thereto.

According to an embodiment, first data terminals IM1 may be provided between the fourth memory die MC4 and the first through vias TV1 of the third memory die MC3. The first data terminals IM1 between the third and fourth memory dies MC3 and MC4 may be provided on and electrically connected to the third active layer ACL3 of the fourth memory die MC4. The first data terminals IM1 may further be provided between the first through vias TV1 of the third memory die MC3 and the first through vias TV1 of the second memory die MC2. The first data terminals IM1 may further be provided between the first through vias TV1 of the second memory die MC2 and the first through vias TV1 of the first memory die MC1. The first data terminals IM1 may further be provided between the buffer die BC and the first through vias TV1 of the first memory die MC1.

A first data input/output path DP1 of the memory stack structure SS may include the first data terminals IM1 that are interposed between the dies and the first through vias TV1 that penetrate the dies. The first data terminals IM1 and the first through vias TV1 may be alternately stacked to constitute a vertical data path. The first data terminals IM1 and the first through vias TV1 of the first data input/output path DP1 may vertically overlap each other. The third active layer ACL3 of the fourth memory die MC4 may be electrically connected through the first data input/output path DP1 to the buffer die BC. Data may be exchanged through the first data input/output path DP1 between the fourth memory die MC4 and the buffer die BC.

According to an embodiment, second data terminals IM2 may be provided between the third memory die MC3 and the second through vias TV2 of the second memory die MC2. The second data terminals IM2 between the second and third memory dies MC2 and MC3 may be provided on and electrically connected to the third active layer ACL3 of the third memory die MC3. The second data terminals IM2 may further be provided between the second through vias TV2 of the second memory die MC2 and the second through vias TV2 of the first memory die MC1. The second data terminals IM2 may further be provided between the buffer die BC and the second through vias TV2 of the first memory die MC1.

A second data input/output path DP2 of the memory stack structure SS may include the second data terminals IM2 that are interposed between the dies and the second through vias TV2 that penetrate the die. The second data terminals IM2 and the second through vias TV2 may be alternately stacked to constitute a vertical data path. The second data terminals IM2 and the second through vias TV2 of the second data input/output path DP2 may vertically overlap each other. The third active layer ACL3 of the third memory die MC3 may be electrically connected through the second data input/output path DP2 to the buffer die BC. Data may be exchanged through the second data input/output path DP2 between the third memory die MC3 and the buffer die BC.

According to an embodiment, third data terminals IM3 may be provided between the second memory die MC2 and the third through vias TV3 of the first memory die MC1. The third data terminals IM3 between the first and second memory dies MC1 and MC2 may be provided on and electrically connected to the third active layer ACL3 of the second memory die MC2. The third data terminals IM3 may further be provided between the buffer die BC and the third through vias TV3 of the first memory die MC1.

A third data input/output path DP3 of the memory stack structure SS may include the third data terminals IM3 that are interposed between the dies and the third through vias TV3 that penetrate the die. The third data terminals IM3 and the third through vias TV3 may be alternately stacked to constitute a vertical data path. The third data terminals IM3 and the third through vias TV3 of the third data input/output path DP3 may vertically overlap each other. The third active layer ACL3 of the second memory die MC2 may be electrically connected through the third data input/output path DP3 to the buffer die BC. Data may be exchanged through the third data input/output path DP3 between the second memory die MC2 and the buffer die BC.

According to an embodiment, fourth data terminals IM4 may be provided between the first memory die MC1 and the buffer die BC. The fourth data terminals IM4 may be provided on and electrically connected to the third active layer ACL3 of the first memory die MC1.

A fourth data input/output path DP4 of the memory stack structure SS may include fourth data terminals IM4 that are interposed between the dies. The third active layer ACL3 of the first memory die MC1 may be electrically connected through the fourth data input/output path DP4 to the buffer die BC. Data may be exchanged through the fourth data input/output path DP4 between the first memory die MC1 and the buffer die BC.

Each of the first to fourth data terminals IM1 to IM4 may be a micro-bump. The first to fourth data terminals IM1 to IM4 may be provided between the first memory die MC1 and the buffer die BC. For example, sixteen data terminals may be provided between the buffer die BC and the first memory die MC1. The first to third data terminals IM1 to IM3 may be provided between the first memory die MC1 and the second memory die MC2. For example, twelve data terminals may be provided between the first and second memory dies MC1 and MC2. The first and second data terminals IM1 and IM2 may be provided between the second memory die MC2 and the third memory die MC3. For example, eight data terminals may be provided between the second and third memory dies MC2 and MC3. The first data terminals IM1 may be provided between the third memory die MC3 and the fourth memory die MC4. For example, four data terminals may be provided between the third and fourth memory dies MC3 and MC4. According to an embodiment, the number of data terminals of the memory stack structure SS may decrease with increasing distance in a vertical direction (e.g., a third direction D3) from the buffer die BC.

The first active layer ACL1 of the logic die SOC may include a first physical-layer interface region PHY1. The second active layer ACL2 of the buffer die BC of each memory stack structure SS may include a second physical-layer interface region PHY2.

Data lines IOd may be provided between the first physical-layer interface region PHY1 and the second physical-layer interface region PHY2. Data may be exchanged through the data lines IOd between the logic die SOC and the buffer die BC.

The interposer substrate IPS may include a plurality of conductive lines CL. The first terminal IMa1 of the first connection terminals IMa1 to IMa4 may be electrically connected through the conductive line CL to the first terminal IMb1 of the second connection terminals IMb1 to IMb4. The second terminal IMa2 of the first connection terminals IMa1 to IMa4 may be electrically connected through the conductive line CL to the second terminal IMb2 of the second connection terminals IMb1 to IMb4. The third terminal IMa3 of the first connection terminals IMa1 to IMa4 may be electrically connected through the conductive line CL to the third terminal IMb3 of the second connection terminals IMb1 to IMb4. The fourth terminal IMa4 of the first connection terminals IMa1 to IMa4 may be electrically connected through the conductive line CL to the fourth terminal IMb4 of the second connection terminals IMb1 to IMb4.

The data lines IOd may be constituted by the conductive lines CL that connect the first connection terminals IMa1 to IMa4 of the logic die SOC to the second connection terminals IMb1 to IMb4 of the buffer die BC.

As mentioned above, FIG. 3 shows an enlarged section M of the first physical-layer interface region PHY1 and an enlarged section N of the second physical-layer interface region PHY2. In FIG. 3, the sections M and N of FIG. 2 are illustrated in an upside down manner.

Referring back to FIG. 3, each of the first substrate SUB1 and the second substrate SUB2 may include a first active region PR and a second active region NR. The first active region PR may be a PMOSFET region, and the second active region NR may be an NMOSFET region. The first active region PR and the second active region NR may be defined by a second trench TR2 formed on an upper portion of each of the first and second substrates SUB1 and SUB2.

A plurality of first active patterns AP1 may be provided on the first active region PR. A plurality of second active patterns AP2 may be provided on the second active region NR. The first and second active patterns AP1 and AP2 may vertically protrude from the first and second substrates SUB1 and SUB2, respectively. A first trench TR1 may be defined between a pair of neighboring active patterns AP1 and AP2.

A device isolation layer ST may be provided on the first and second substrates SUB1 and SUB2. The device isolation layer ST may fill the first and second trenches TR1 and TR2. For example, the device isolation layer ST may include a silicon oxide layer.

An upper portion of each of the first active patterns AP1 may include a first channel CH1, and an upper portion of each of the second active patterns AP2 may include a second channel CH2.

The first and second channels CH1 and CH2 may be positioned higher than a top surface STt of the device isolation layer ST. The first and second channels CH1 and CH2 may vertically protrude above the device isolation layer ST. The first and second channels CH1 and CH2 may have a fin shape that protrudes from the device isolation layer ST.

A gate electrode GE may be provided to extend crossing over the first and second active patterns AP1 and AP2. The gate electrode GE may vertically overlap the first and second channels CH1 and CH2. Each of the gate electrodes GE may be provided on a top surface and opposite sidewalls of each of the first and second channels CH1 and CH2.

A gate dielectric layer GI may be interposed between the gate electrode GE and the first and second channels CH1 and CH2. The gate dielectric layer GI may extend along a bottom surface of the gate electrode GE. The gate dielectric layer GI may cover the top surface and the opposite sidewalls of each of the first and second channels CH1 and CH2. A gate capping layer GP may be provided on the gate electrode GE.

A first interlayer dielectric layer ILD1, a second interlayer dielectric layer ILD2, and a third interlayer dielectric layer ILD3 may be sequentially stacked on the gate capping layer GP. A gate contact GC may be provided to penetrate the first interlayer dielectric layer ILD1 and the gate capping layer GP and to have electrical connection with the gate electrode GE. A first connection line layer ILL1 may be provided in the second interlayer dielectric layer ILD2. A second connection line layer ILL2 may be provided in the third interlayer dielectric layer ILD3. Each of the first and second connection line layers ILL1 and ILL2 may include a plurality of connection lines IL and a plurality of vias VI. Although not shown, additional connection line layers may further be provided on the second connection line layer ILL2.

The channels CH1 and CH2 respectively of the first and second transistors TRT1 and TRT2 according to an embodiment of the disclosure may be positioned higher than the top surface STt of the device isolation layer ST, and thus may have a three-dimensional shape. For example, each of the first and second transistors TRT1 and TRT2 may be a three-dimensional transistor. For example, each of the first and second transistors TRT1 and TRT2 according to an embodiment of the disclosure may be a fin field effect transistor (FinFET) having a fin-shaped channel.

The first transistors TRT1 of the first physical-layer interface region PHY1 may have substantially the same structure as that of the second transistors TRT2 of the second physical-layer interface region PHY2. For example, a first pitch PI1 may be provided between the active patterns AP1 and AP2 of the first transistors TRT1. A second pitch PI2 may be provided between the active patterns AP1 and AP2 of the second transistors TRT2. The first pitch PI1 and the second pitch PI2 may be substantially the same. According to an embodiment, the first pitch PI1 and the second pitch PI2 may be the same.

A logic process may be used to form the first transistors TRT1 of the first physical-layer interface region PHY1. The same logic process may be used to form the second transistors TRT2 of the second physical-layer interface region PHY2.

The second physical-layer interface region PHY2 of the buffer die BC may operate at substantially the same speed and performance as those of the first physical-layer interface region PHY1 of the logic die SOC. According to an embodiment, the second physical-layer interface region PHY2 of the buffer die BC may operate at the same speed and performance as those of the first physical-layer interface region PHY1 of the logic die SOC.

Referring back to FIGS. 1 to 3, a logic circuit of the second active layer ACL2 of the buffer die BC may process data signals between the second connection terminals IMb1 to IMb4 on the first surface BCa and the first to fourth data terminals IM1 to IM4 on the second surface BCb. For example, the second physical-layer interface region PHY2 may process data signals between the second connection terminals IMb1 to IMb4 on the first surface BCa and the first to fourth data terminals IM1 to IM4 on the second surface BCb.

The second transistors TRT2 that constitute a logic circuit of the second physical-layer interface region PHY2 may have substantially the same structure as that of the first transistors TRT1 that constitute a logic circuit of the first physical-layer interface region PHY1 of the logic die SOC. For example, the second transistors TRT2 may adopt transistors (e.g., three-dimensional transistors such as FinFET or GAAFET) used for the logic die SOC, and thus may operate at high speeds. The buffer die BC may decrease the number of data lines connected to the first to fourth memory dies MC1 to MC4. According to an embodiment, the buffer die BC may increase data rates as compared to the data rates of the first to fourth memory dies MC1 to MC4.

The number of data lines between the buffer die BC and the interposer substrate IPS may be less than the number of data lines between the first memory die MC1 and the buffer die BC. The number (e.g., 4) of the second connection terminals IMb1 to IMb4 between the buffer die BC and the interposer substrate IPS may be less than the number (e.g., 16) of the first to fourth data terminals IM1 to IM4 between the first memory die MC1 and the buffer die BC. The number of the first to fourth data terminals IM1 to IM4 between the first memory die MC1 and the buffer die BC may be greater than twice the number of the second connection terminals IMb1 to IMb4 between the buffer die BC and the interposer substrate ISP. For example, the number of the first to fourth data terminals IM1 to IM4 on the second surface BCb may be 2 to 4 times the number of the second connection terminals IMb1 to IMb4 on the first surface BCa.

For example, the buffer die BC may be input with data through the four first data terminals IM1 of the first data input/output path DP1. For example, four first data lines are provided in the first data input/output path DP1. Data input to the buffer die BC may be processed in a logic circuit of the second physical-layer interface region PHY2, and then output to a single first terminal IMb1. For example, a single second data line is provided between the buffer die BC and the interposer substrate ISP. The buffer die BC may reduce the number of the second data lines to one-fourth of the number of the first data lines, but may increase data rates of the second data lines to 4 times as compared to data rates of the first data lines.

In certain embodiments, the first to fourth data terminals IM1 to IM4 and the second connection terminals IMb1 to IMb4 may be terminals for transmitting data signals. The disclosure, however, is not limited thereto. The first to fourth data terminals IM1 to IM4 and the second connection terminals IMb1 to IMb4 may include terminals for transmitting powers, command signals, and access signals in addition to data signals. For example, the total number of terminals (e.g., micro-bumps) between the first memory die MC1 and the buffer die BC may be 2 to 4 times than the total number of terminals (e.g., micro-bumps) between the buffer die BC and the interposer substrate ISP.

Figure 4:
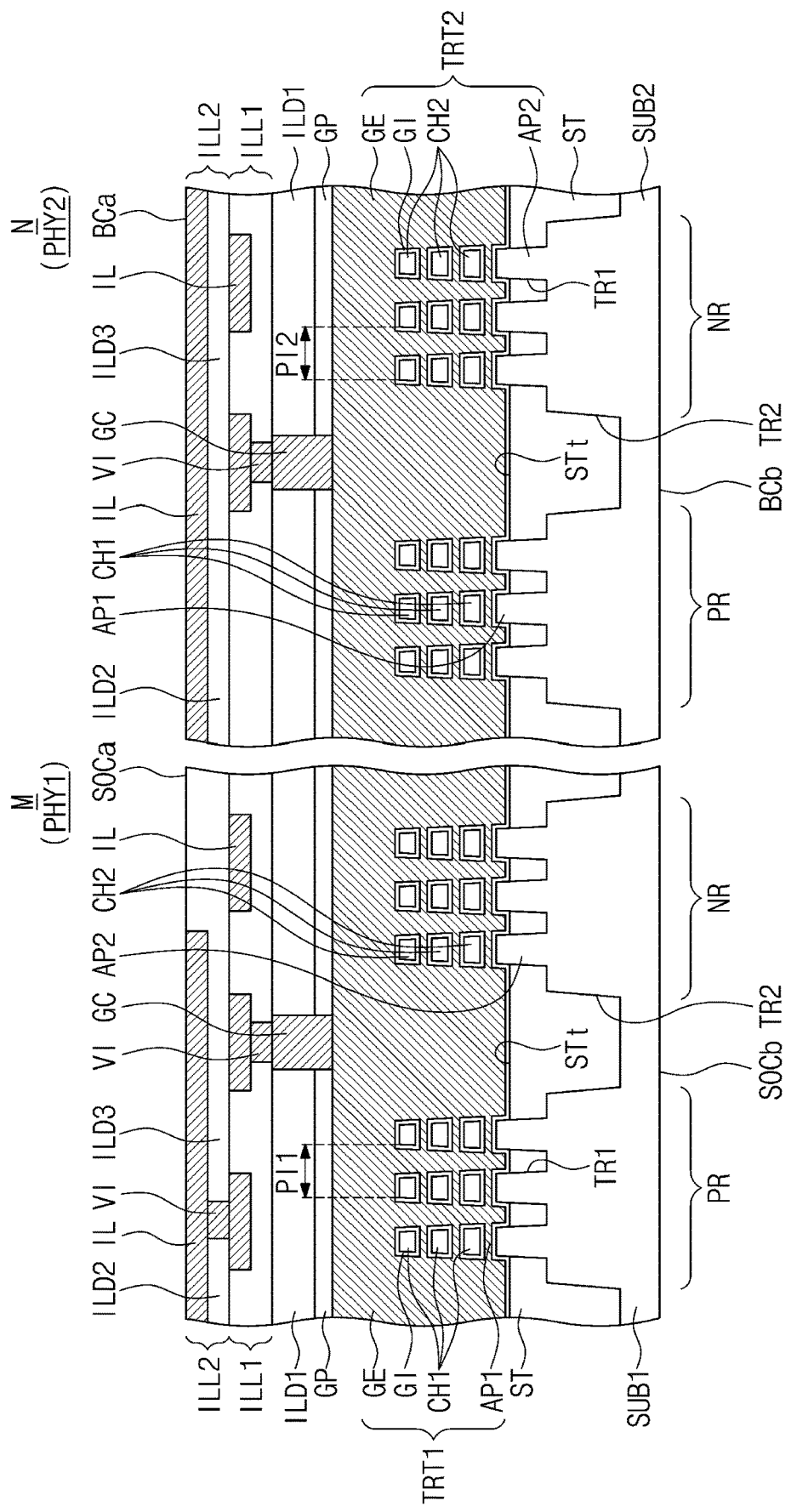
FIG. 4 illustrates an enlarged cross-sectional view of sections M and N in FIG. 2, showing a semiconductor package according to an embodiment of the disclosure.

FIG. 4 illustrates an enlarged cross-sectional view of sections M and N in FIG. 2, showing a semiconductor package according to an embodiment of the disclosure. A detailed description of technical features repetitive to those discussed above with reference to FIGS. 1 to 3 will be omitted, and a difference thereof will be explained in detail.

Referring to FIG. 4, the first channels CH1 may be provided on the first active pattern AP1. The first channels CH1 on the first active pattern AP1 may be vertically spaced apart from each other. The second channels CH2 may be provided on the second active pattern AP2. The second channels CH2 on the second active pattern AP2 may be vertically spaced apart from each other.

The first and second channels CH1 and CH2 may be positioned higher than the top surface STt of the device isolation layer ST. For example, a lowermost one of the stacked first channels CH1 may have a bottom surface higher than the top surface STt of the device isolation layer ST.

The gate electrode GE may surround each of the first and second channels CH1 and CH2. The gate electrode GE may be provided on a top surface, a bottom surface, and opposite sidewalls of each of the first and second channels CH1 and CH2. The gate dielectric layer GI may be interposed between the gate electrode GE and each of the first and second channels CH1 and CH2. The gate dielectric layer GI may cover the top surface, the bottom surface, and the opposite sidewalls of each of the first and second channels CH1 and CH2.

The channels CH1 and CH2 respectively of the first and second transistors TRT1 and TRT2 according to an embodiment of the disclosure may be positioned higher than the top surface STt of the device isolation layer ST, and thus may have a three-dimensional shape. For example, each of the first and second transistors TRT1 and TRT2 may be a three-dimensional transistor. For example, each of the first and second transistors TRT1 and TRT2 according to an embodiment of the disclosure may be a gate-all-around field effect transistor (GAAFET) in which a gate surrounds a channel.

Figure 5:
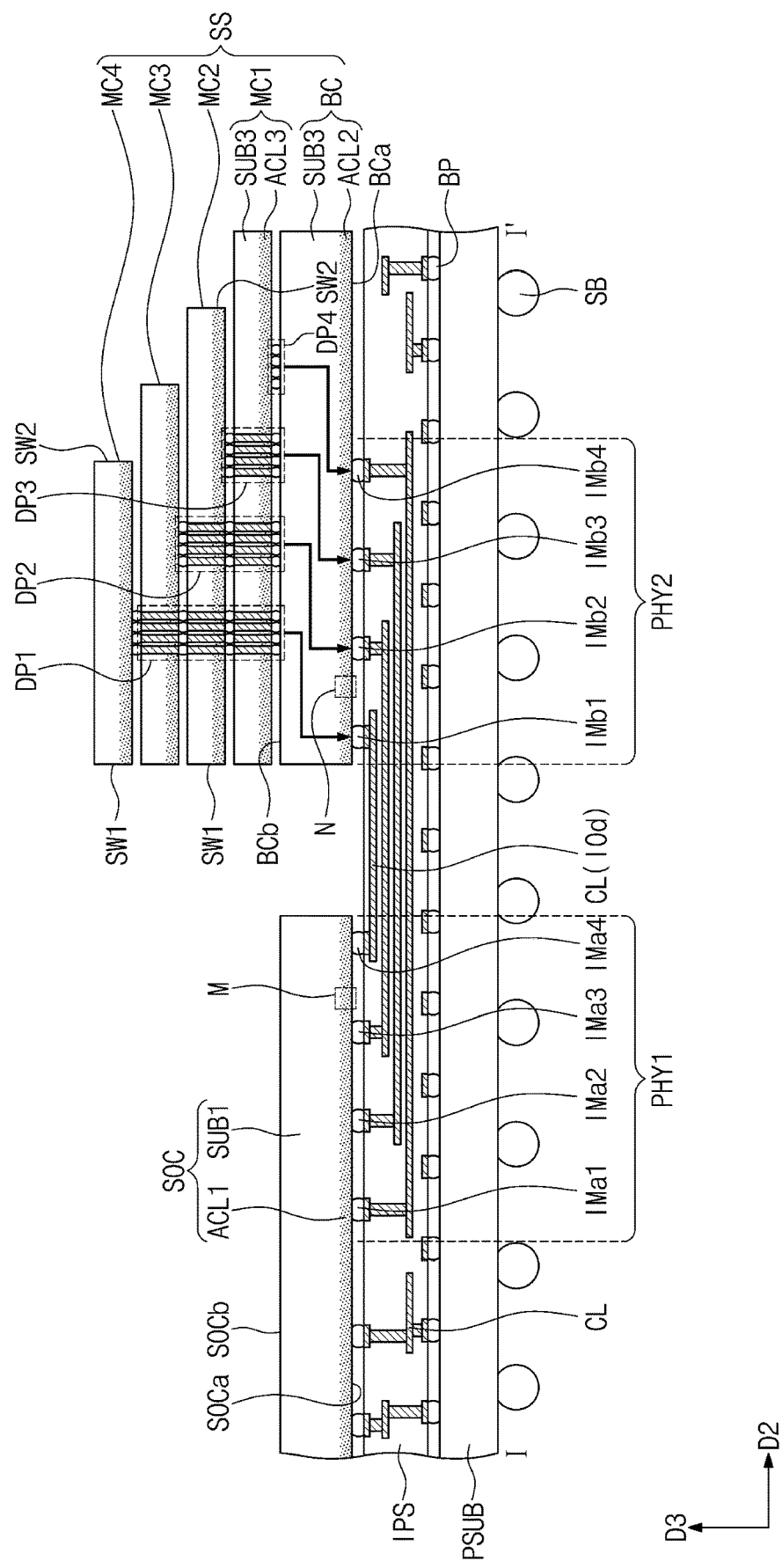
FIG. 5 illustrates a cross-sectional view taken along line I-I' of FIG. 1, showing a semiconductor package according to an embodiment of the disclosure.

FIG. 5 illustrates a cross-sectional view taken along line I-I' of FIG. 1, showing a semiconductor package according to an embodiment of the disclosure. A detailed description of technical features repetitive to those discussed above with reference to FIGS. 1 to 3 will be omitted, and a difference thereof will be explained in detail.

Referring to FIGS. 1 and 5, the first to fourth memory dies MC1 to MC4 may be dynamic random access memory (DRAM) chips. In certain embodiments, the first to fourth memory dies MC1 to MC4 may have different chip sizes.

Among the first to fourth memory dices MC1 to MC4, the first memory die MC1 may have the largest planar area. Among the first to fourth memory dices MC1 to MC4, the fourth memory die MC4 may have the smallest planar area. The third memory die MC3 may have a planar area greater than that of the fourth memory die MC4. The second memory die MC2 may have a planar area greater than that of the third memory die MC3. The planar area of the first memory die MC1 may be greater than that of the second memory die MC2.

The fourth memory die MC4 may include the first data input/output path DP1 alone, and may thus have a relatively small chip size. In contrast, the first memory die MC1 may include the first to fourth data input/output paths DP1 to DP4, and may thus have a relative large chip size.

Each of the first to fourth memory dies MC1 to MC4 may have a first sidewall SW1 and a second sidewall SW2 opposite to each other. The first sidewalls SW1 of the first to fourth memory dies MC1 to MC4 may be aligned in the third direction D3.

The second sidewall SW2 of the third memory die MC3 may protrude more in the second direction D2 than the second sidewall SW2 of the fourth memory die MC4. The second sidewall SW2 of the second memory die MC2 may protrude more in the second direction D2 than the second sidewall SW2 of the third memory die MC3. The second sidewall SW2 of the first memory die MC1 may protrude more in the second direction D2 than the second sidewall SW2 of the second memory die MC2. In such cases, the first to fourth memory dies MC1 to MC4 may be stacked in a stepwise structure.

A semiconductor package according to one or more embodiments of the disclosure may use a buffer die that includes a transistor formed by a logic process, and thus may promptly process data signals between a logic die and a memory stack structure. An increase in data rate between the logic die and the buffer die of the memory stack structure may improve electrical characteristics and operating speeds of the semiconductor package.

Although some example embodiments of the disclosure have been discussed with reference to accompanying figures, it will be understood that various changes in form and details may be made therein without departing from the spirit and scope of the disclosure. It therefore will be understood that the some example embodiments described above are just illustrative but not limitative in all aspects.

What is claimed is:

1. A semiconductor package, comprising:
a logic die provided on an interposer substrate; and
a memory stack structure provided adjacent to the logic die,
wherein the memory stack structure comprises:
a buffer die provided on the interposer substrate; and
a plurality of memory dies stacked on the buffer die,
wherein the buffer die has a first surface that faces the interposer substrate and a second surface that faces the plurality of memory dies, and
a plurality of first data lines provided between the buffer die and the plurality of memory dies; and
a plurality of second data lines provided between the buffer die and the interposer substrate,
wherein a number of data terminals on the second surface is greater than a number of connection terminals on the first surface,
wherein the buffer die comprises a logic circuit configured to process data signals between the data terminals on the second surface and the connection terminals on the first surface,
wherein a number of the plurality of first data lines is N times a number of the plurality of second data lines,
wherein the buffer die is configured to allow data rates of the plurality of second data lines to be N times data rates of the plurality of first data lines,
wherein N is 2 to 4.

2. The semiconductor package of claim 1, wherein the buffer die comprises an active layer configured to allow the plurality of second data lines to have first data rates greater than second data rates of the plurality of first data lines.

3. The semiconductor package of claim 2, wherein the active layer of the buffer die comprises a three-dimensional transistor having a three-dimensional structured channel.

4. The semiconductor package of claim 1, wherein the memory stack structure further comprises a data input/output path that vertically connects the buffer die to a first memory die of the plurality of memory dies,
wherein the data input/output path comprises a plurality of through vias.

5. The semiconductor package of claim 1, wherein the plurality of memory dies comprise a first memory die provided on the buffer die and a second memory die provided on the first memory die,
wherein a planar area of the first memory die is greater than a planar area of the second memory die.

6. A semiconductor package, comprising:
a logic die provided on an interposer substrate; and a memory stack structure provided adjacent to the logic die,
wherein the memory stack structure comprises:
a buffer die provided on the interposer substrate;
a memory die provided on the buffer die;
a plurality of first data lines provided between the buffer die and the plurality of memory dies; and
a plurality of second data lines provided between the buffer die and the interposer substrate,
wherein a number of first bumps between the buffer die and the memory die is greater than a number of second bumps between the buffer die and the interposer substrate,
wherein the buffer die comprises a logic circuit configured to process data signals between the first bumps and the second bumps
wherein a number of the plurality of first data lines is N times a number of the plurality of second data lines,
wherein the buffer die is configured to allow data rates of the plurality of second data lines to be N times data rates of the plurality of first data lines,
wherein N is 2 to 4.

7. The semiconductor package of claim 6, wherein the buffer die comprises an active layer, wherein the active layer of the buffer die is configured to allow the second data lines to have first data rates greater than second data rates of the first data lines.

8. The semiconductor package of claim 7, wherein the active layer of the buffer die comprises a three-dimensional transistor having a three-dimensional structured channel.

9. The semiconductor package of claim 5, wherein
the logic die comprises a first physical-layer interface region,
the buffer die comprises a second physical-layer interface region,
the first and second physical-layer interface regions are connected to each other by a data line, and
a first transistor of the first physical-layer interface region has a structure substantially same as a structure of a second transistor of the second physical-layer interface region.

10. The semiconductor package of claim 1, wherein the number of data terminals on the second surface is 2 to 4 times the number of connection terminals on the first surface.

11. The semiconductor package of claim 6, wherein the number of first bumps between the buffer die and the memory die is 2 to 4 times the number of second bumps between the buffer die and the interposer substrate.

12. The semiconductor package of claim 6, wherein the buffer die is structurally different from the memory die.

13. A semiconductor package, comprising:
a logic die provided on an interposer substrate; and
a memory stack structure provided adjacent to the logic die,
wherein the memory stack structure comprises:
a buffer die provided on the interposer substrate;
a plurality of memory dies stacked on the buffer die;
a plurality of first data lines provided between the buffer die and the plurality of memory dies; and
a plurality of second data lines provided between the buffer die and the interposer substrate,
wherein a number of the plurality of first data lines is N times a number of the plurality of second data lines,
wherein the buffer die is configured to allow data rates of the plurality of second data lines to be N times data rates of the plurality of first data lines,
wherein N is 2 to 4.

14. The semiconductor package of claim 13, wherein the buffer die is structurally different from the plurality of memory dies.

15. The semiconductor package of claim 13, wherein the plurality of first data lines comprise a plurality of through vias that vertically connect the buffer die to the plurality of memory dies.

16. The semiconductor package of claim 13, wherein the plurality of memory dies comprise a first memory die provided on the buffer die and a second memory die provided on the first memory die,
wherein a planar area of the first memory die is greater than a planar area of the second memory die.

* * * * *